US011210191B2

(12) United States Patent
Wolfe et al.

(10) Patent No.: US 11,210,191 B2
(45) Date of Patent: *Dec. 28, 2021

(54) USING STEADY-STATE CHANGES TO DISCERN THE OPERATING PERFORMANCE OF AN INDIVIDUAL MACHINE OPERATING ON A COMMONLY SUPPLIED ELECTRICAL NETWORK CONNECTED TO MULTIPLE MACHINES

(71) Applicant: Fischer Block, Inc., West Chester, PA (US)

(72) Inventors: Gregory R. Wolfe, Royersford, PA (US); Margaret P. Paietta, Royersford, PA (US)

(73) Assignee: Fischer Block, Inc., West Chester, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,649

(22) Filed: Jun. 8, 2020

(65) Prior Publication Data
US 2020/0301802 A1    Sep. 24, 2020

Related U.S. Application Data

(63) Continuation of application No. 16/008,514, filed on Jun. 14, 2018, now Pat. No. 10,678,668.
(Continued)

(51) Int. Cl.
*G06F 11/30* (2006.01)
*G06F 11/32* (2006.01)
(Continued)

(52) U.S. Cl.
CPC ........ *G06F 11/3058* (2013.01); *G01R 31/086* (2013.01); *G01R 31/088* (2013.01); *G06F 11/327* (2013.01); *G06F 11/3476* (2013.01)

(58) Field of Classification Search
CPC .............. G06F 11/3058; G06F 11/327; G06F 11/3476; G01R 31/086; G01R 31/088; G01R 21/133; G01R 31/343
See application file for complete search history.

(56) References Cited

U.S. PATENT DOCUMENTS 7,385,365 B2 * 6/2008 Feick ..................... H02P 29/02
318/400.01
7,605,579 B2   10/2009 Bester et al.
(Continued)

FOREIGN PATENT DOCUMENTS

| CN | 109143067 B | * | 2/2021 | ........... G01R 31/343 |
| GB | 2374147 A | * | 10/2002 | ......... G05B 23/0235 |
| WO | 2019158754 A4 | | 8/2019 | |

*Primary Examiner* — Jay Patidar
(74) *Attorney, Agent, or Firm* — Morgan, Lewis & Bockius LLP

(57) ABSTRACT

A device, which may be embedded in a power distribution enclosure, enables analysis of the conditions of an electromechanical machine operating on a commonly supplied network with other electromechanical machines. The analysis preferably uses aggregate operating voltage and current signals supplied to or from such machines along with known changes in steady-state conditions of one or more machines to discern the discrete effect of one or more machines to the aggregate electrical signal. Such discrete effect can then be associated with the operating performance of the individual machine. And, since such voltage and current signals are normally readily available at the enclosure, wiring or any other communication means to any sensors on the electromechanical machines or devices are not necessary. The embedded device may optionally receive or transmit information to a computing or monitoring device remote from the enclosure.

13 Claims, 5 Drawing Sheets

Related U.S. Application Data

(60) Provisional application No. 62/519,253, filed on Jun. 14, 2017.

(51) Int. Cl.
*G01R 31/08* (2020.01)
*G06F 11/34* (2006.01)

(56) References Cited

U.S. PATENT DOCUMENTS

| | | |
|---|---|---|
| 9,071,110 B2 * | 6/2015 | Lalonge ................. H02K 11/20 |
| 10,257,959 B2 | 4/2019 | Warren et al. |
| 2009/0151369 A1 | 6/2009 | Lifson et al. |

* cited by examiner

USING STEADY-STATE CHANGES TO DISCERN THE OPERATING PERFORMANCE OF AN INDIVIDUAL MACHINE OPERATING ON A COMMONLY SUPPLIED ELECTRICAL NETWORK CONNECTED TO MULTIPLE MACHINES

CROSS-REFERENCE TO RELATED APPLICATIONS

This application is a Continuation of U.S. application Ser. No. 16/088,514, filed Jun. 14, 2018, which claims the benefit of U.S. Provisional Patent Application No. 62/519,253 filed Jun. 14, 2017, each of which are hereby incorporated herein by reference in their entireties.

BACKGROUND

The present invention relates, in general, to assessing the operating conditions of one or more electromechanical machines, such as electric motors and, in particular, to the use of steady-state measurements of aggregate operating voltage and current signals, supplied to and/or from such machines, relative to known changes in steady-state conditions of one or more individual machines, to determine the discrete effect, to the aggregate signal, of such one or more individual machines and, to associate such discrete effect to the operating performance of such individual machine or machines. Optionally, a component of the assessment may include comparing such discrete effect with previous measurements of the same or similar machines to determine what level, if any, of deterioration in performance.

Many devices identified and tracked in industrial processes are critical to an ongoing production line, which if stopped for unplanned reasons, can result in substantial monetary loss to the owners and operators of such processes. Failure of such devices is usually progressive and can happen over the course of months and years. Examples of such devices include refrigerators, air conditioners, pumps, motors, generators, compressors, and fans. Many times, the operating characteristics of these devices is unknown and/or the ongoing operation of these devices is taken for granted and, unfortunately, the devices are usually not serviced until they fail.

Existing industry methods for identifying the operating performance of a given electromechanical machine or driver device consist of either 1) connecting one or more sensors to each individual machine or device and measuring the sensor outputs directly to determine operating performance, or 2) measuring the aggregate voltage and current signals associated with multiple machines and devices, all connected to a common electrical supply network, and performing analysis based on predetermined time-dependent behaviors of each individual machine or device. An example of such a time-dependent behavior would be a turn-on event.

Methods which assess machine performance utilizing measurements taken from individual sensors connected to each individual machine in a network, require significant physical infrastructure and/or financial investment associated with installing sensors on each of multiple machines and running wiring from each machine to one or more intelligent devices to analyze and process the measured signals.

Methods which assess machine performance without the need for sensors connected to each individual machine, but instead make aggregate measurements of voltage and current signals traveling to/from multiple machines on a commonly supplied electrical network, require the use of predetermined time-dependent behaviors of the individual machines, such as turn-on events, possess significant shortcomings in that performance related problems typically associated with time-dependent events, such as turn-on events, are typically caused by machine-connected driver devices and not the machines themselves. Thus, in many cases, such methods fail to notice certain operating performance problems associated with the critical and expensive machine, but instead may only notice performance problems associated with the less critical and inexpensive driver device which may be connected to such critical machine. Examples of such inexpensive driver devices include a motor start capacitor, which typically runs for 0.1 to 1 second in time while starting. As another example, many critical machines such as air conditioners are generally turned on and off by a mechanical relay device. Such relays typically fail because the contacts erode due to arcing. The arcing generally occurs only during startup, so the load may continue to start until a contact completely fails.

SUMMARY

Certain implementations of the disclosed technology may include a process or multiple processes for monitoring the efficiency, operating performance, and/or pending failure of certain, e.g., common, electrical machines or devices found in residential or commercial production lines or facilities. When a loss of efficiency or pending failure is detected, a process may generate and send an alert to the facility and/or production operators. In addition, a process may make regular reports and/or support queries regarding the condition and operating status of pertinent devices.

Certain implementations of the disclosed technology may include a periodic measuring of the common electrical network parameters as measured before and after a steady-state state change is made to one or more individual machines on such network. In some embodiments, a steady-state condition of one or more individual machines includes a duration of time in which one or more inputs to such one or more machines are kept at constant level or levels with little or no variation so as to cause the output or outputs of such machine or machines to also display constant level or levels with little or no varying. Alternatively, or in addition thereto, an alert may be generated when the efficiency or operating performance of certain identified machines is reduced by a calculated or predetermined amount, whether or not such machine has actually failed to perform its intended function. Certain implementations of the disclosed technology may support queries and/or provide regular reports regarding the operating conditions of certain identified electromechanical machines and devices.

The invention described herein can be implemented by connecting and supplying several machines, on a common electrical network and then making one or more known changes in steady-state conditions for each machine, in-turn, and each time, comparing the aggregate signals made before and after such changes in steady-state conditions to determine the discrete effects of each machine to the total measured aggregate signal. In some embodiments, a discrete effect includes a measurable change in one or more outputs of such machine or machines which can be determined to be caused by a change in state of one or more inputs. Such discrete effect data-sets for each machine can then each be, stored in a database and used for historical comparison purposes to ascertain the level of deterioration in performance of any given machine. And, by repeating the above steps, for each machine, can provide the ability to apply the described technique at any point in time in the future to ascertain the then level of performance or deterioration thereof.

Some embodiments provide a method for a processor to determine the discrete effect or effects of one or more individual electrical devices, each connected, to and operating in a common electrical network, to an aggregate electrical signal of such common electrical network, whereby one or more other electrical devices are also connected to and operating in such electrical network, comprising: making a first electrical measurement of the aggregate electrical signal while the common electrical network is in a steady-state condition, making a known change in one or more steady-state conditions of one or more individual electrical devices, making a second electrical measurement of the aggregate electrical signal while the common electrical network is in a steady-state condition, comparing the first electrical measurement to the second electrical measurement to determine a residual difference between the measurements, associating the residual difference between the first and second measurements to determine the discrete effects of the one or more individual electrical devices, to the aggregate electrical signal.

In some embodiments, the discrete effect of the one or more individual electrical devices is correlated to the operating performance of the one or more individual electrical devices.

In some embodiments, the operating performance is compared to the operating performance specifications as provided by the manufacturer of such individual electrical device or devices.

In some embodiments, the operating performance of the one or more individual electrical devices is stored in a database for later comparing to other measurements.

In some embodiments, the comparison to other measurements is used for the purpose of determining the amount of operating performance degradation between measurements. In some embodiments, performance degradation includes the comparison of two or more measurements of the level of a specific output of a specific machine, in which such two or more measurements are made at different points in time, and any observed change in such two or more measurements, is indicative in the deterioration in desired performance of such machine.

In some embodiments, the operating performance may include operating efficiency.

In some embodiments, the electrical device may include one or more rotating elements.

In some embodiments, the one or more steady-state conditions may include one or more of rotating speed, torque, temperature, vibration, load, or a machine setting.

In some embodiments, an aggregate electrical signal may include one or more of current and voltage.

In some embodiments, the discrete effects of such aggregate electrical signals may be represented in either of the time or frequency domains.

In some embodiments, the operating performance is used to generate an alert to a user of the method.

In some embodiments, the change in operating performance is used to generate an alert to a user of the method.

In some embodiments, the total discrete effect, to the total aggregate signal, of the one or more machines or devices, is determined when one and only one of either the first or second steady-state condition is the off state.

BRIEF DESCRIPTION OF THE SEVERAL VIEWS OF THE DRAWINGS

The foregoing summary, as well as the following detailed description of embodiments of the invention, will be better understood when read in conjunction with the appended drawings of an exemplary embodiment. It should be understood, however, that the invention is not limited to the precise arrangements and instrumentalities shown.

In the drawings.

DETAILED DESCRIPTION OF ILLUSTRATIVE EMBODIMENTS

Figure 1A:
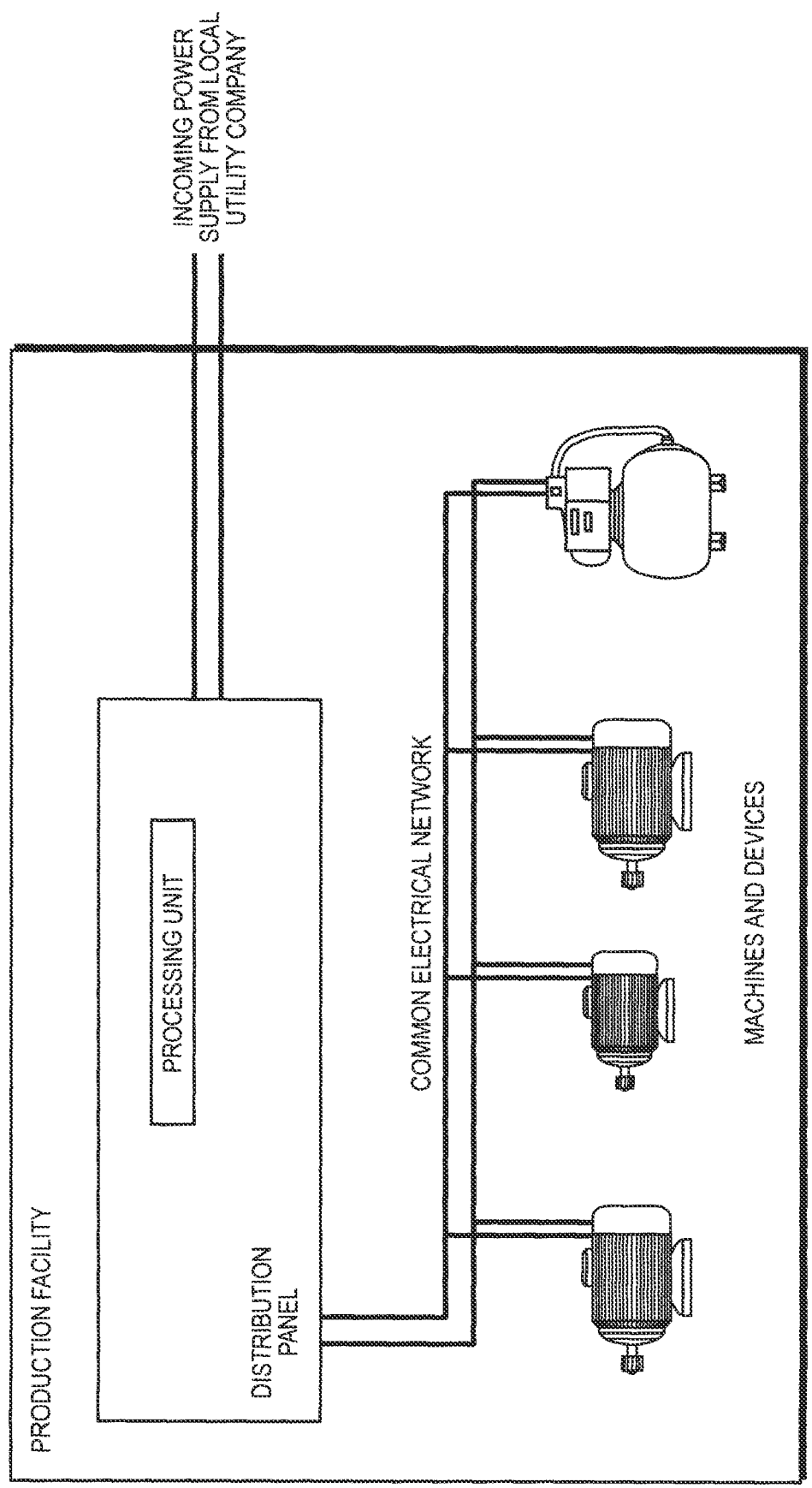
FIG. 1A depicts an example electrical network suitable for use with embodiments of the system described herein.

FIG. 1A depicts an example electrical network suitable for use with embodiments of the system described herein. In an embodiment, one or more production facilities can have one or more electrical sources which can provide power to an electrical network. For example, one of the sources can be an incoming power supply that originates from a local utility company, or other external power source. Additionally, one or more electricity generators (which can also be a part of the one or more electrical sources) can be connected together, in series, parallel, hi-phase, or any combination thereof, to create a common electrical network. Additionally, one or more machines and/or devices can be connected to the common electrical network, and which can use the one or more electrical sources as power supplies. The one or more sources and the one or more machines and/or devices can be connected through the common electrical network, which can be routed and controlled through a distribution panel. The distribution panel can contain a processing unit to monitor the common electrical network.

Figure 1B:
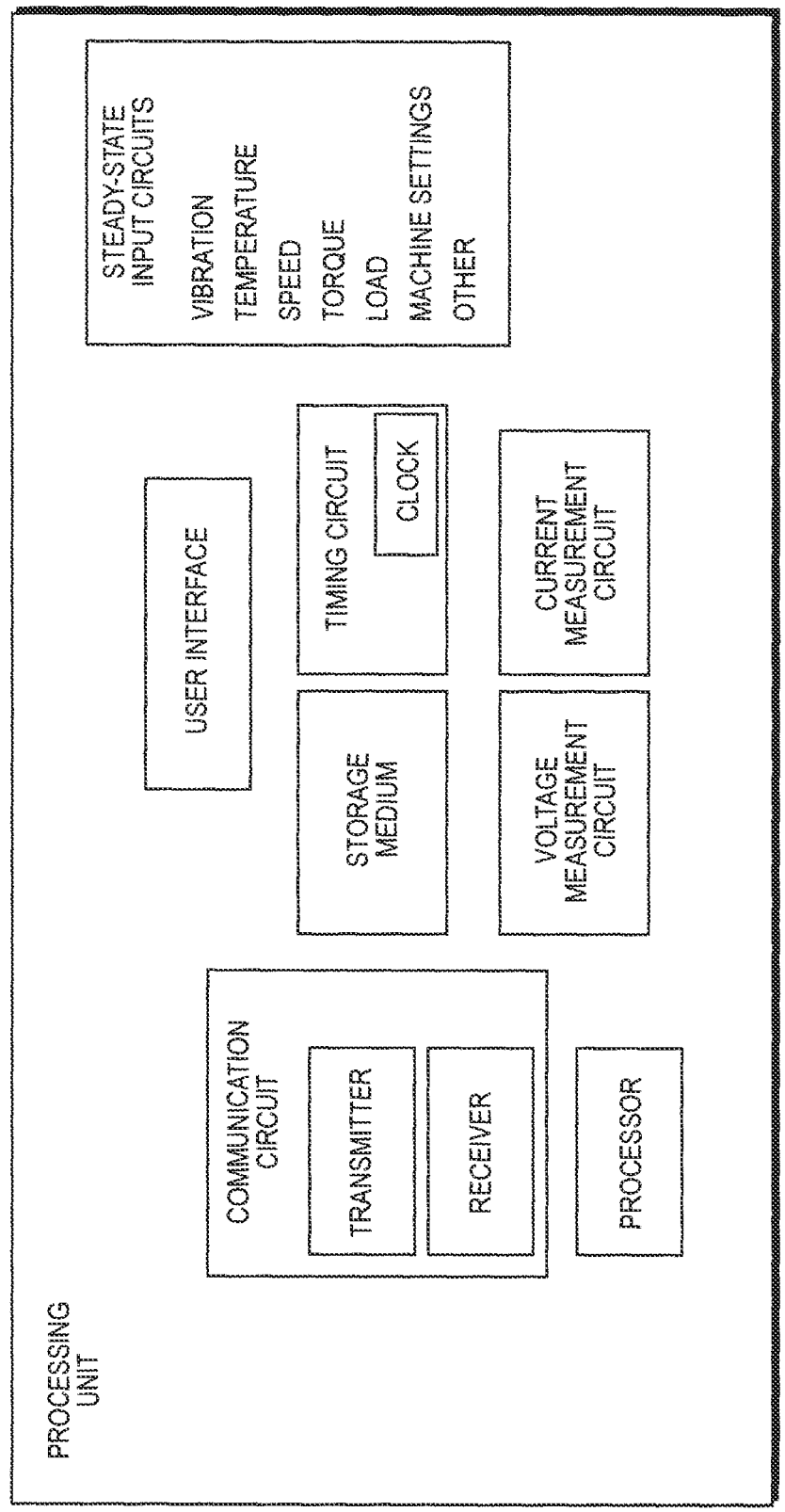
FIG. 1B depicts a block diagram illustrating the components of an example processing unit for implementing the system and methods described in accordance with embodiments disclosed herein.

FIG. 1B depicts a block diagram illustrating the components of an example processing unit for implementing the system and methods described in accordance with embodiments disclosed herein. The processing unit can comprise at least one of a user interface, a storage medium, a timing circuit with a clock, a current measurement circuit, a voltage measurement circuit, a steady-state input or circuit that can be used to measure or alter characteristics such as vibration, temperature, speed, torque, load, machine settings, or other characteristics, a communication circuit with a transmitter and a receiver, and one or more processors. The steady-state input or circuit can be used by a user for inputting and/or auto-sensing the steady-state conditions of a given machine. These steady-state conditions can be mechanical in nature and the effects are then observed in the electrical measurements (of voltage and current) as described in the embodiments disclosed herein. The components of the processing unit can act in conjunction to implement the method and system described herein.

Figure 2A:
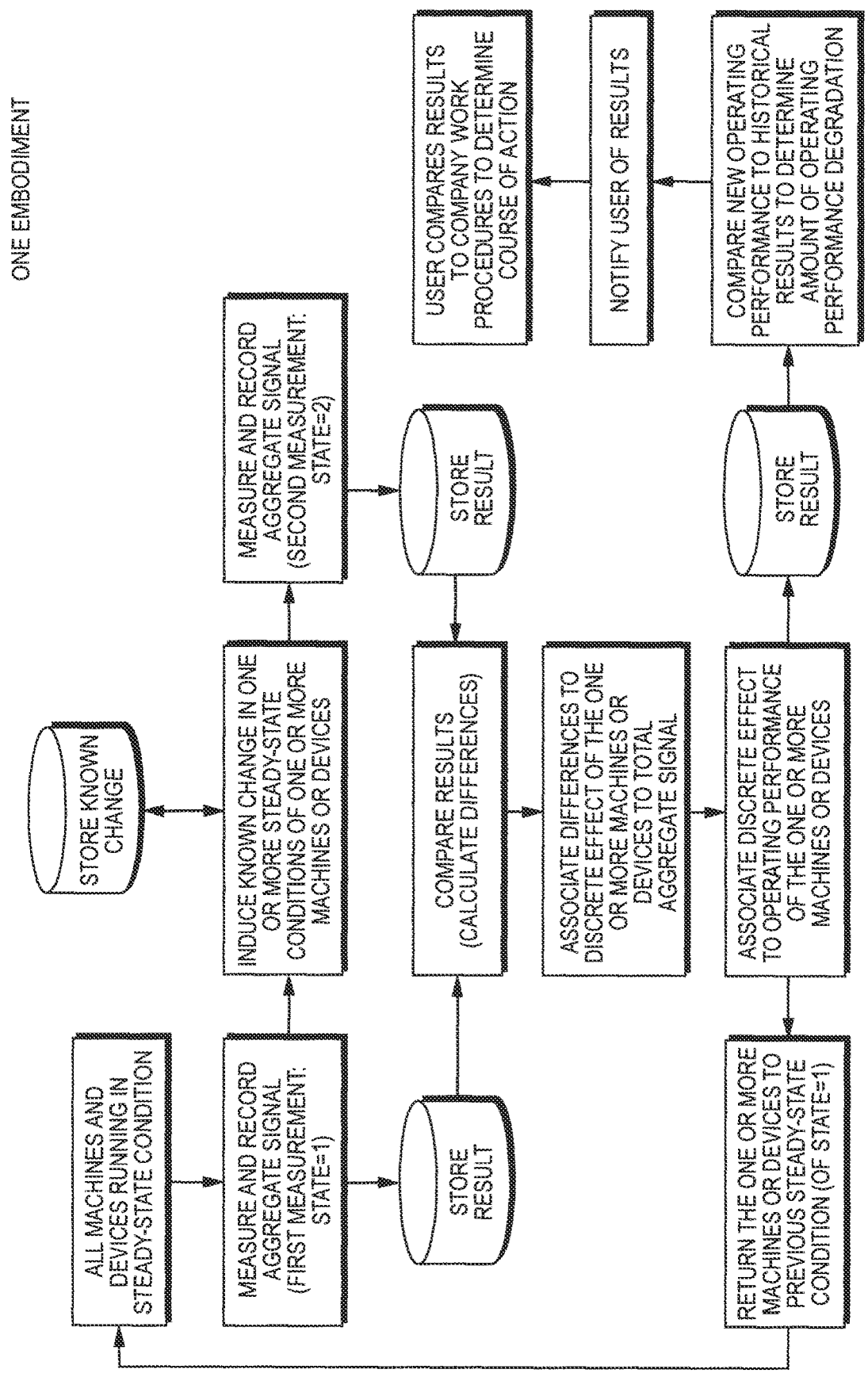
FIG. 2A depicts a flowchart describing the functionality of the effect detection method, in accordance with embodiments described herein.

FIG. 2A depicts a flowchart describing the functionality of the effect detection method, in accordance with embodiments described herein. In an embodiment, the method can begin when all of the one or more machines and/or devices connected to the electrical network are running in a steady-state condition, wherein steady-state can denote that all the machines and/or devices in the network are in mechanical and electrical equilibrium. While in steady-state, the system can measure and record the aggregate signal output by the electrical network, which can be recorded using an external recording/measuring mechanism, or through one of the measurement circuits within, the processing unit. The system can denote the first aggregate output measurement as the first state, and can store the result in a repository or database. The system can then induce a known change (such as, a change in rotating speed) in one or more steady-state conditions of the one or more machines or devices, and can store the known change in the repository. Once the known change in the one or more steady-state conditions is introduced to the one or more machines or devices, the system can measure and record the altered aggregate signal, which can then be recorded in the repository. The system can denote the altered aggregate signal measurement as the second state.

The system can then compare the results between the measurements taken, which can be a calculation of the differences between the measurements. The system can then associate the difference to discrete effect of the one or more machines or devices to the total aggregate signal. The system can then associate the discrete effect of the operating performance of the one or more machines or devices. The system can then record the result, and return the one or more machines or devices to their previous steady state condition, also known as the first state.

The system can compare the new operating performance to the historical results in order to determine an amount of operating performance degradation based upon the induced changes. Based on the comparison, the system can notify the user of the comparison results. The user can them compare the comparison results to company work procedures in order to determine a course of action with regards to the electrical network.

Figure 2B:
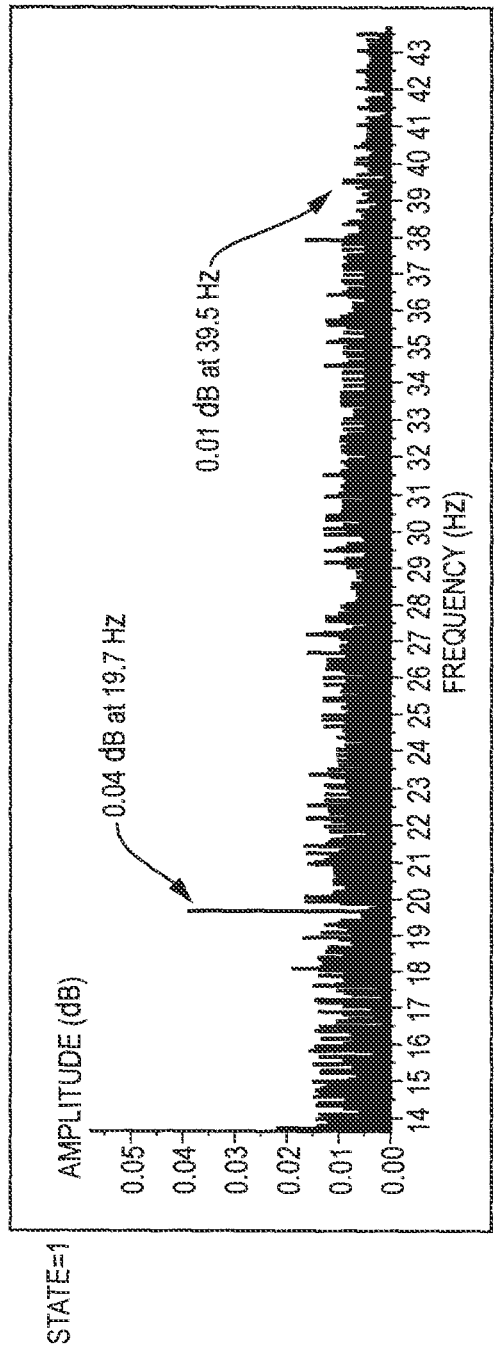
FIG. 2B depicts example measurements of the total aggregate electrical signal taken from the electrical network at the first and second states as determined by an implementation of the system and method described in accordance with embodiments herein.
Figure 2B:
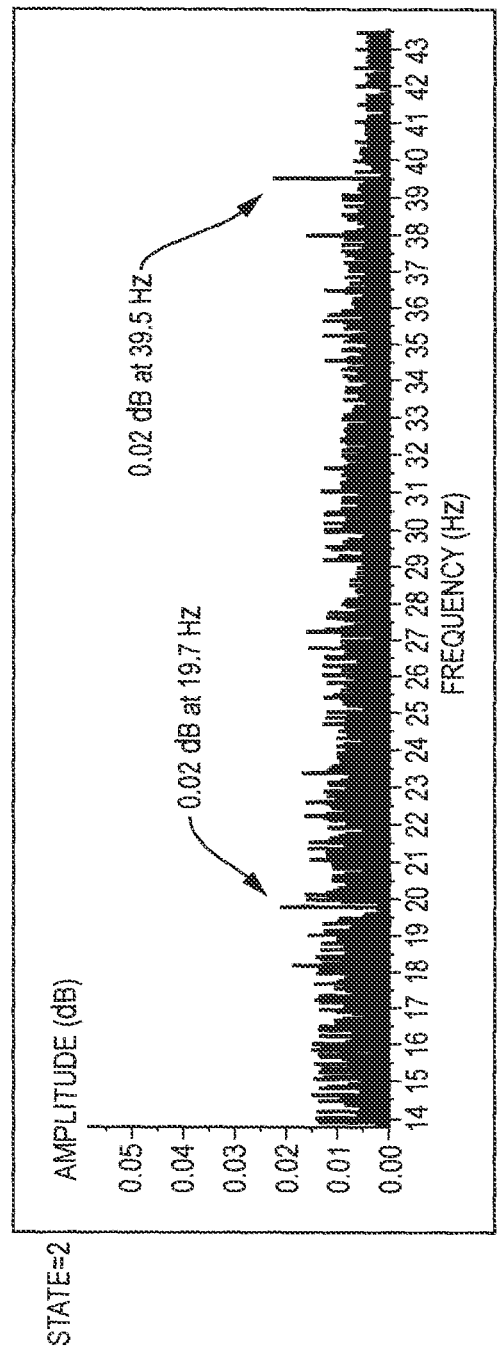

FIG. 2B depicts example measurements of the total aggregate electrical signal taken from the electrical network at the first and second states as determined by an implementation of the system and method described in accordance with embodiments herein. In the first state, the aggregate electrical signal shows a spike of 0.04 decibels at 19.7 Hz, and a value of 0.01 decibels at 39.5 Hz. In the second state (which, in accordance with embodiments described herein, occurs after a known change of the steady-state conditions is induced into one or more machines or devices in the electrical network), the measured aggregate electrical signal shows a reduction of the amplitude in the 19.7 Hz band to 0.02 decibels, while the amplitude at 39.5 Hz has increased to 0.02 decibels.

Figure 2C:
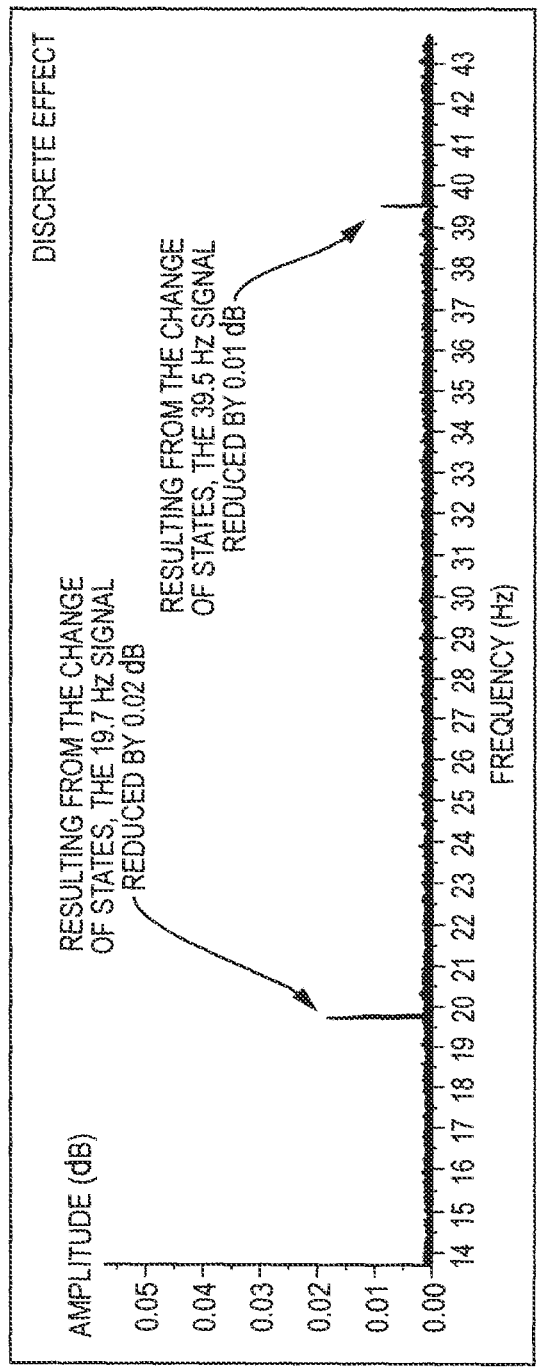
FIG. 2C depicts the calculated difference of, example measurements of the total aggregate electrical signal taken from the electrical network at the first and second states as determined by an implementation of the system and method described in accordance with embodiments herein.

FIG. 2C depicts the calculated difference of example measurements of the total aggregate electrical signal taken from the electrical network at the first and second states as determined by an implementation of the system and method described in accordance with embodiments herein. The graph of the calculated differences highlights the change by 0.02 decibels in the 19.7 Hz band and the change by 0.01 decibels in the 39.5 Hz band. As described above in FIG. 2A, the operating performance of the one or more individual machines or devices can be associated with the change from the first state to the second state. These signal elements can be compared to future signal elements associated with the same or similar change in steady-state conditions of the one or more individual machine or device to ascertain the amount of performance degradation associated with such machine or device.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only.

Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

What is claimed is:

1. A method to determine the effects of one or more electrical devices, each connected to and operating in an electrical network, to an aggregate electrical signal representative of the electrical network, wherein one or more other electrical devices are also connected to and operating in the electrical network, comprising:
   at a processor in electrical communication with the electrical network:
      measuring a first electrical measurement value of the aggregate electrical signal while the electrical network is in a first steady-state condition,
      measuring a second electrical measurement value of the aggregate electrical signal while the electrical network is in a second steady-state condition resulting from a change to the first steady-state condition of one or more electrical devices,
      comparing the first electrical measurement value to the second electrical measurement value to determine a difference between the first and second electrical measurement values,
      associating the difference between the first and second electrical measurement values to determine discrete effects of the one or more electrical devices, to the aggregate electrical signal.

2. The method of claim 1, wherein the discrete effects of the one or more electrical devices is associated to an operating performance of the one or more electrical devices.

3. The method of claim 2 further comprising: comparing the operating performance of the one or more electrical devices to operating performance specifications of the one or more electrical devices.

4. The method of claim 2 further comprising: storing the operating performance of the one or more electrical devices in a database for later comparison to other measurement values.

5. The method of claim 4 further comprising: determining an amount of operating performance degradation between the first electrical measurement value and the second electrical measurement value by comparison to other measurement values.

6. The method of claim 5, further comprising: generating an alert based on a change in operating performance of the one or more electrical devices.

7. The method of claim 2, wherein the operating performance includes operating efficiency.

8. The method of claim 2, further comprising: generating an alert based on the operating performance of the one or more electrical devices.

9. The method of claim 1, wherein the one or more electrical device includes one or more rotating elements.

10. The method of claim 1, wherein the first and second steady state-conditions includes one or more rotating speed, torque, temperature, vibration, voltage, or current of the one or more electrical devices.

11. The method of claim 1, wherein the aggregate electrical signal includes one or more of a current signal and a voltage signal.

12. The method of claim 11, wherein the discrete effects of the aggregate electrical signal is represented in either a time or frequency domain.

13. The method of claim 1, wherein a discrete effect to a total aggregate signal of the one or more electrical devices is determined when one of either the first steady-state condition or the second steady-state condition is in an off state.

\* \* \* \* \*